United States Patent
Chen et al.

(10) Patent No.: US 12,278,141 B2
(45) Date of Patent: Apr. 15, 2025

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Kuo-Ju Chen, Taichung (TW); Shih-Hsiang Chiu, New Taipei (TW); Meng-Han Chou, Hsinchu (TW); Su-Hao Liu, Jhongpu Township (TW); Liang-Yin Chen, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 489 days.

(21) Appl. No.: 17/675,462

(22) Filed: Feb. 18, 2022

(65) Prior Publication Data

US 2022/0406655 A1    Dec. 22, 2022

Related U.S. Application Data

(60) Provisional application No. 63/212,193, filed on Jun. 18, 2021.

(51) Int. Cl.
*H01L 21/76* (2006.01)
*H01L 21/31* (2006.01)
(Continued)

(52) U.S. Cl.
CPC .. *H01L 21/76825* (2013.01); *H01L 21/31155* (2013.01); *H01L 21/76805* (2013.01); *H01L 21/76895* (2013.01)

(58) Field of Classification Search
CPC ......... H01L 21/76825; H01L 21/31155; H01L 21/76805; H01L 21/76895
See application file for complete search history.

(56) References Cited

U.S. PATENT DOCUMENTS

| 8,062,965 B2 | 11/2011 | Kaim et al. |
| 10,170,286 B2 | 1/2019 | Colvin et al. |

(Continued)

FOREIGN PATENT DOCUMENTS

| TW | I558664 B | 11/2016 |
| TW | 201822262 A | 6/2018 |
| TW | I685878 B | 2/2020 |

OTHER PUBLICATIONS

Current, M.I. et al., "Chapter 3—Commercial Ion Implantation Systems," Ion Implantation Science and Technology—2018, Ion Implant Technology Co., Sep. 2018, 42 pages.

*Primary Examiner* — Nicole M Ippolito
(74) *Attorney, Agent, or Firm* — Slater Matsil, LLP

(57) ABSTRACT

Semiconductor devices and methods of manufacturing semiconductor devices are described herein. A method includes implanting neutral elements into a dielectric layer, an etch stop layer, and a metal feature, the dielectric layer being disposed over the etch stop layer and the metal feature being disposed through the dielectric layer and the etch stop layer. The method further includes using a germanium gas as a source for the neutral elements and using a beam current above 6.75 mA to implant the neutral elements.

20 Claims, 11 Drawing Sheets

(51) Int. Cl.
*H01L 21/3115* (2006.01)
*H01L 21/768* (2006.01)

(56) References Cited

U.S. PATENT DOCUMENTS

| | | | |
|---|---|---|---|
| 10,665,613 B2 | 5/2020 | Hodo et al. | |
| 2010/0025576 A1* | 2/2010 | Adams | H01J 37/08 |
| | | | 250/288 |
| 2018/0218878 A1* | 8/2018 | Xu | H01J 37/28 |
| 2021/0189550 A1* | 6/2021 | Byl | C23C 14/48 |

\* cited by examiner

SEMICONDUCTOR DEVICES AND METHODS OF MANUFACTURE

PRIORITY CLAIM AND CROSS-REFERENCE

This application claims the benefit of U.S. Provisional Application No. 63/212,193, filed on Jun. 18, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
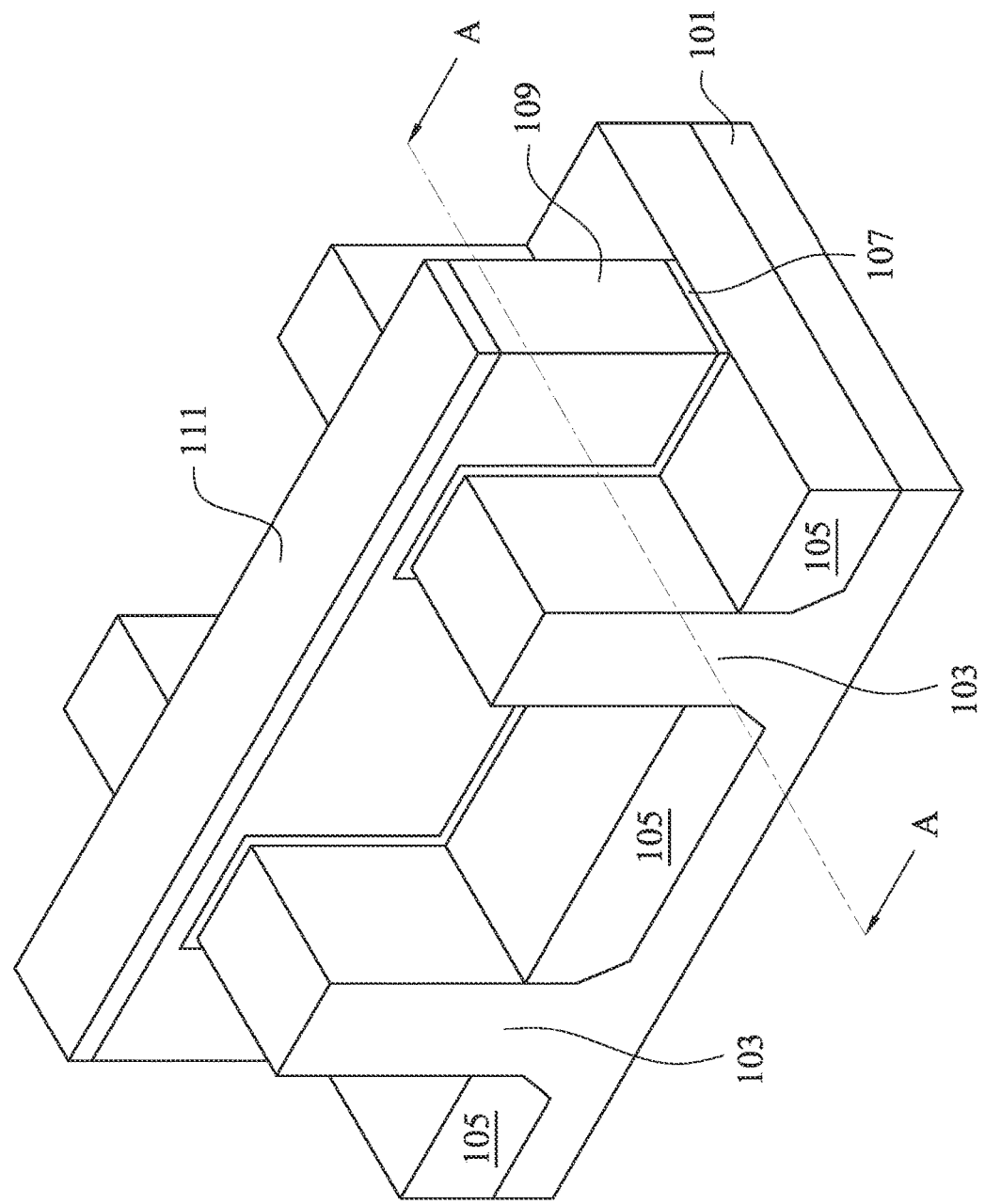
FIG. 1 is a three-dimensional view of an intermediate structure at a stage during an example method for forming a conductive feature in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides methods for a high throughput implantation process that may be utilized in the formation of conductive features in a semiconductor device. Some embodiments utilize a low cost gas resource with a high ion beam current in a method for pre-amorphization implantation (PAI) and/or post silicide implantation (PSI) for the formation of a conductive plug in an interlayer dielectric to connect with a conductive structure under the interlayer dielectric. The method includes filling an opening through an interlayer dielectric with a conductive fill material and using the high ion beam current during implantation into the interlayer dielectric. As such, gaps and cracks between the conductive fill material and the interlayer dielectric may be eliminated which reduces the parasitic resistance of the device being formed. The implantation can create compression stress between the conductive fill material and the interlayer dielectric to close gaps and cracks between the materials, thus, preventing loss of the conductive structure under the conductive fill material during a subsequent planarization process, such as a chemical mechanical polishing (CMP) process. Embodiments can be used in any suitable situations to remove gaps between two materials.

Example embodiments described herein are described in the context of forming conductive features in Back End of the Line (BEOL) and/or Middle End of the Line (MEOL) processing. Embodiments described herein are in the context of forming a conductive feature to a Fin Field Effect Transistor (FinFET) (e.g., to a gate structure of a FinFET). Other embodiments may be implemented in other contexts, such as with different devices, such as planar Field Effect Transistors (FETs), nanostructure Field Effect Transistors (NanoFETs), bipolar junction transistors (BJTs), diodes, capacitors, inductors, resistors, etc. In some embodiments, the conductive feature can be in an intermetallization dielectric in BEOL processing. Implementations of some aspects of the present disclosure may be used in other processes and/or in other devices.

Some variations of the example methods and structures are described. A person of ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1 is a three-dimensional view of an intermediate structure at a stage during an example method for forming a conductive feature in accordance with some embodiments. FIGS. 2 through 7 illustrate cross-sectional views of respective intermediate structures at respective stages during the example method for forming a conductive feature in accordance with some embodiments.

The intermediate structure of FIG. 1, as described in the following, is used in the implementation of FinFETs. Other structures may be implemented in other example embodiments. The intermediate structure includes first and second fins 103 formed on a semiconductor substrate 101, with respective isolation regions 105 on the semiconductor substrate 101 between neighboring fins 103. The semiconductor substrate 101 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 101 may include an elemental semiconductor such as silicon (Si) or germanium (Ge); a compound semiconductor; an alloy semiconductor; or a combination thereof.

The fins 103 are formed on the semiconductor substrate 101, such as by etching trenches in the semiconductor substrate 101 to form the fins 103. The fins 103 may be patterned in the semiconductor substrate 101 by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 103.

Isolation regions 105 are formed with each being in a corresponding trench. The isolation regions 105 may include or be an insulating material such as an oxide (such as silicon oxide), a nitride, the like, or a combination thereof, and the insulating material may be deposited using an appropriate deposition process. The insulating material may be recessed after being deposited to form the isolation regions 105. The insulating material is recessed such that the fins 103 protrude from between neighboring isolation regions 105, which may, at least in part, thereby delineate the fins 103 as active areas on the semiconductor substrate 101. Further, top surfaces of the isolation regions 105 may have a flat surface as illustrated, a convex surface, a concave surface (such as dishing), or a combination thereof, which may result from an etch process. A person of ordinary skill in the art will readily understand that the processes described above are just examples of how the fins 103 may be formed. In other examples, the fins 103 may be formed by other processes and may include heteroepitaxial and/or homoepitaxial structures.

In the embodiment shown in FIG. 1, a dummy gate stack is formed along respective sidewalls of and over the fins 103. The dummy gate stack is for a replacement gate process, as described herein. The dummy gate stack extends longitudinally perpendicularly to respective longitudinal directions of the fins 103. The dummy gate stack includes a first interfacial dielectric 107 along and on the fins 103, a dummy gate 109 over the first interfacial dielectric 107, and a mask 111 over the dummy gate 109.

The first interfacial dielectric 107 may include or be silicon oxide, silicon nitride, the like, or multilayers thereof. The dummy gate 109 may include or be silicon (e.g., polysilicon) or another material. The mask 111 may include or be silicon nitride, silicon oxynitride, silicon carbon nitride, the like, or a combination thereof. Layers for the first interfacial dielectric 107, dummy gate 109, and mask 111 for the dummy gate stack may be sequentially deposited or formed, such as by any acceptable deposition technique, and then patterned, for example, using photolithography and one or more etch processes, into the dummy gate stack.

Figure 2:
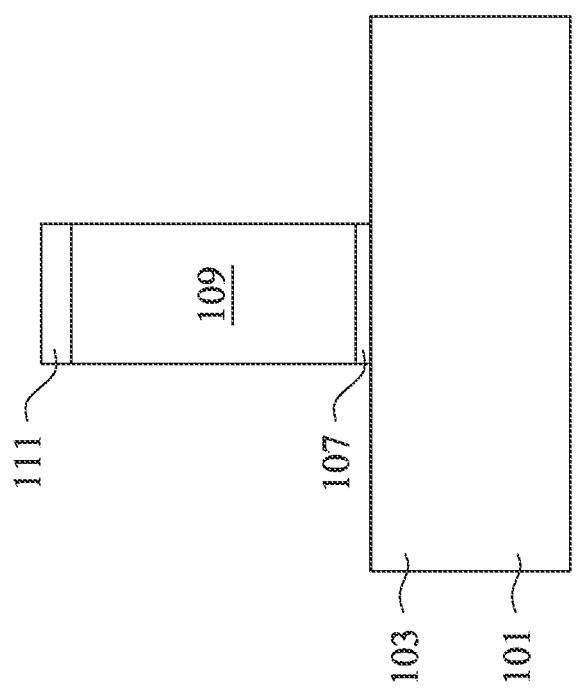

FIG. 1 further illustrates a reference cross-section that is used in later figures. Cross-section A-A is in a plane along, e.g., channels in the fin 103 between opposing source/drain regions. FIGS. 2 through 7 illustrate cross-sectional views at various stages of processing in the example method corresponding to cross-section A-A. FIG. 2 illustrates a cross-sectional view of the intermediate structure of FIG. 1 at the cross-section A-A.

Figure 3:
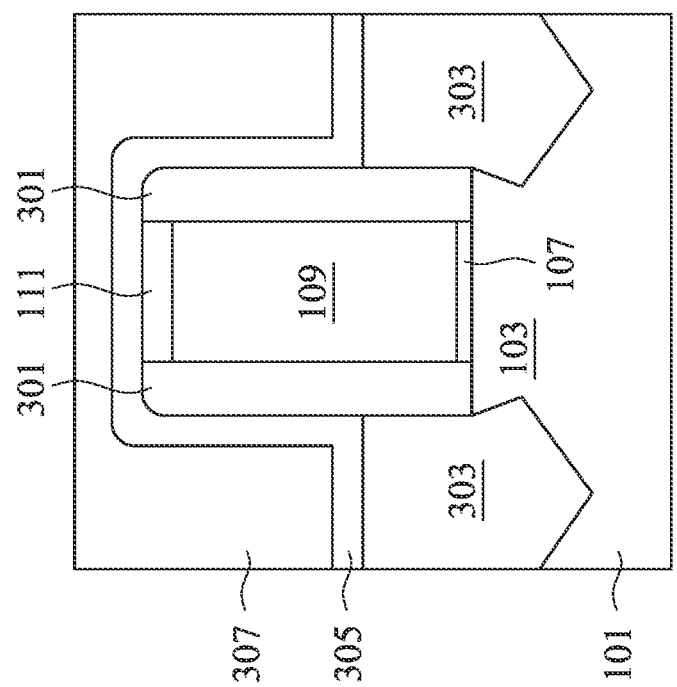
FIGS. 2 through 7 illustrate cross-sectional views of respective intermediate structures at respective stages during the example method for forming a conductive feature in accordance with some embodiments.

FIG. 3 illustrates the formation of gate spacers 301, source/drain regions 303, a contact etch stop layer (CESL) 305, and a first interlayer dielectric (ILD) 307. The gate spacers 301 are formed along sidewalls of the dummy gate stack (e.g., sidewalls of the first interfacial dielectrics 107, dummy gates 109, and masks 111) and over the fins 103. The gate spacers 301 may be formed by conformally depositing one or more layers for the gate spacers 301 and anisotropically etching the one or more layers, for example. The one or more layers for the gate spacers 301 may include or be silicon nitride, silicon oxynitride, silicon carbon nitride, the like, multi-layers thereof, or a combination thereof.

After formation of the gate spacers 301, recesses are formed in the fins 103 on opposing sides of the dummy gate stack (e.g., using the dummy gate stack and gate spacers 301 as a mask) by an etch process. The source/drain regions 303 are formed in the recesses by an appropriate epitaxial growth or deposition process. The source/drain regions 303 may include or be silicon germanium, silicon carbide, silicon phosphorus, silicon carbon phosphorus, pure or substantially pure germanium, a III-V compound semiconductor, a II-VI compound semiconductor, or the like. In other embodiments, the recessing and epitaxial growth may be omitted, and the source/drain regions 303 may be formed by implanting dopants into the fins 103 using the dummy gate stack and gate spacers 301 as masks.

After formation of the source/drain regions 303, the CESL 305 is conformally deposited, by an appropriate deposition process, on surfaces of the source/drain regions 303, sidewalls and top surfaces of the gate spacers 301, top surfaces of the masks 111, and top surfaces of the isolation regions 105. Generally, an etch stop layer (ESL) can provide a mechanism to stop an etch process when forming, e.g., contacts or vias. An ESL may be formed of a dielectric material having a different etch selectivity from adjacent layers or components. The CESL 305 may comprise or be silicon nitride, silicon carbon nitride, silicon carbon oxide, carbon nitride, the like, or a combination thereof.

The first ILD 307 is then deposited, by an appropriate deposition process, on the CESL 305. The first ILD 307 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, silicon carbon material, a compound thereof, a composite thereof, the like, or a combination thereof.

Figure 4:
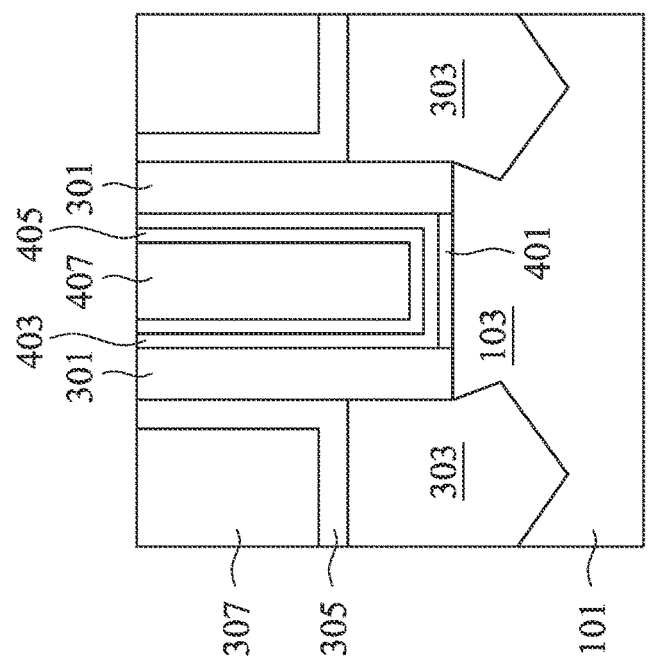

In FIG. 4, a planarization process, such as a CMP, may be performed to level the top surfaces of the first ILD 307 and CESL 305 with the top surface of the dummy gate 109. The dummy gate 109 and first interfacial dielectric 107 are removed by one or more etch processes. A replacement gate structure is formed in the recess where the dummy gate stack was removed. The replacement gate structure includes, as illustrated, a second interfacial dielectric 401, a gate dielectric layer 403, one or more optional conformal layers 405, and a gate conductive fill material 407. The second interfacial dielectric 401 is formed on sidewalls and top surfaces of the fins 103 along the channel regions. The second interfacial dielectric 401 can be, for example, the first interfacial dielectric 107 if not removed, an oxide (e.g., silicon oxide) formed by thermal or chemical oxidation of the fin 103, and/or an oxide (e.g., silicon oxide), nitride (e.g., silicon nitride), and/or another dielectric layer.

The gate dielectric layer 403 can be conformally deposited in the recesses where the dummy gate stack was removed (e.g., on top surfaces of the isolation regions 105, on the second interfacial dielectric 401, and sidewalls of the gate spacers 301) and on the top surfaces of the first ILD 307, the CESL 305, and gate spacers 301. The gate dielectric layer 403 can be or include silicon oxide, silicon nitride, a high-k dielectric material, multilayers thereof, or other dielectric material. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

Then, the one or more optional conformal layers 405 can be conformally (and sequentially, if more than one) deposited on the gate dielectric layer 403. The one or more optional conformal layers 405 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 407 is formed over the one or more optional conformal layers 405 (e.g., over the one or more work-function tuning layers), if implemented, and/or the gate dielectric layer 403. The gate conductive fill material 407 can fill the remaining recess where the dummy gate stack was removed. The gate conductive fill material 407 may be or comprise a metal-containing material such as tungsten, cobalt, aluminum, ruthenium, copper, multi-layers thereof, a combination thereof, or the like. Portions of the gate conductive fill material 407, one or more optional conformal layers 405, and gate dielectric layer 403 above the top surfaces of the first ILD 307, the CESL 305, and gate spacers 301 are removed, such as by a CMP. The replacement gate structure comprising the gate conductive fill material 407, the one or more optional conformal layers 405, the gate dielectric layer 403, and the second interfacial dielectric 401 may therefore be formed as illustrated in FIG. 4.

Figure 5:
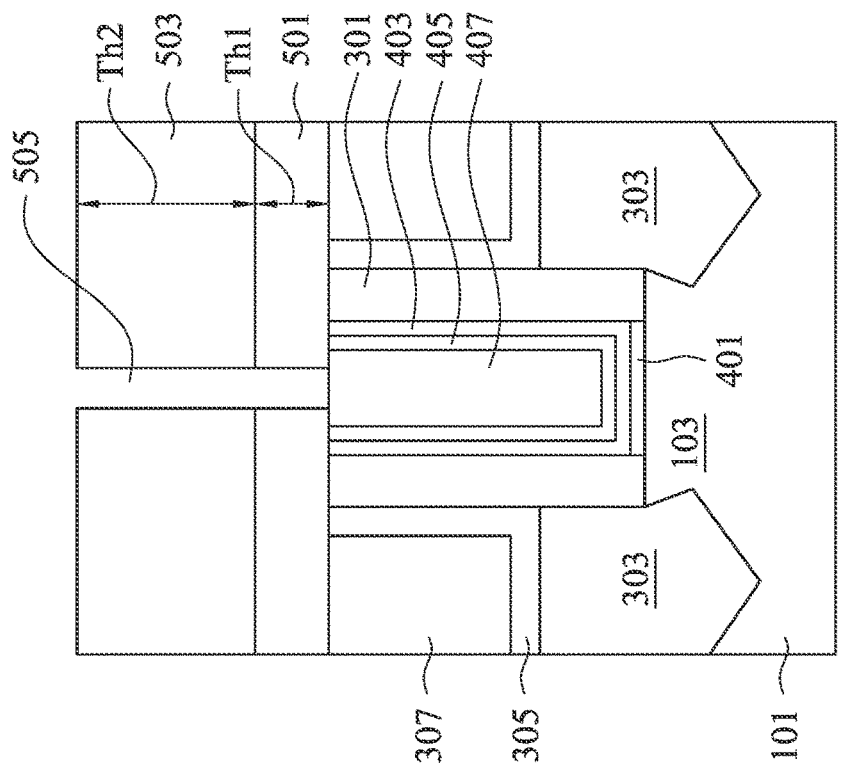

In FIG. 5, an ESL (etch stop layer) 501 is deposited over the first ILD 307, CESL 305, gate spacers 301, and replacement gate structure. The ESL 501 may comprise or be silicon nitride, silicon carbon nitride, carbon nitride, the like, or a combination thereof. In some embodiments, the ESL 501 has a first thickness Th1 in a range from about 20 Å to about 500 Å, for example about 200 Å.

A second ILD 503 is deposited over the ESL 501. The second ILD 503 may comprise or be silicon dioxide, a low-k dielectric material, silicon oxynitride, PSG, BSG, BPSG, USG, FSG, OSG, SiOxCy, silicon carbon material, a compound thereof, a composite thereof, the like, or a combination thereof. In some embodiments, the second ILD 503 has a second thickness Th2 in a range from about 20 Å to about 500 Å. In some embodiments, the ESL 501 may not be implemented, and the second ILD 503 may be directly deposited on the first ILD 307, CESL 305, gate spacers 301, and replacement gate structure.

A first opening 505 is then formed through the second ILD 503 and the ESL 501 to expose at least a portion of the replacement gate structure. The second ILD 503 and the ESL 501 may be patterned with the first openings 505, for example, using photolithography and one or more etch processes.

Figure 6:
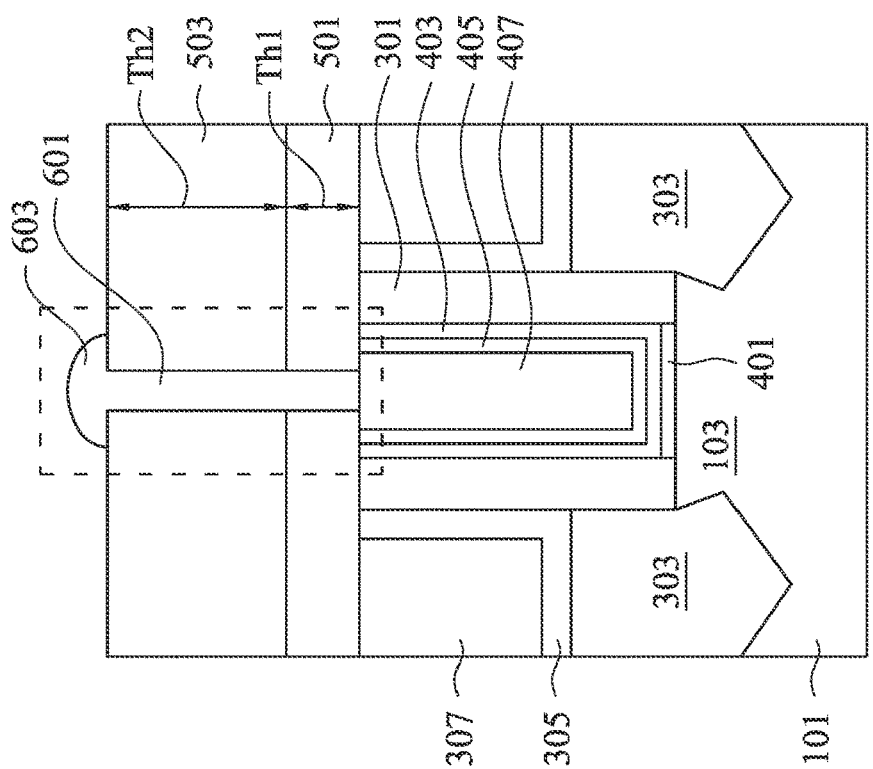

In FIG. 6, a conductive feature 601 is formed in the first openings 505. In some embodiments, the conductive feature 601 is formed directly in the first openings 505 to connect with the replacement gate structure without using any adhesion layer and/or barrier layer in between. The conductive feature 601 is grown on a top surface of the gate conductive fill material 407, gradually filling the first openings 505 from the bottom in a bottom-up manner. After filling the first openings 505, the conductive feature 601 overfills the first openings 505 forming an overfill portion 603. The overfill portion 603 is above the top surface of the second ILD 503. The overfill portion 603 generally has a larger diameter than the first openings 505. The bottom-up formation enables direct connection between the conductive feature 601 and the gate conductive fill material 407, which may reduce connection resistance. The bottom-up manner filling may also reduce undesired defects, such as voids or seams. For example, voids or seams may be avoided because the likelihood of early closure of the first openings 505 can be reduced because of the bottom-up formation.

In some embodiments, the conductive feature 601 can be deposited in the first openings 505 by chemical vapor deposition (CVD), selective atomic layer deposition (ALD), electroless deposition (ELD), electroplating, physical vapor deposition (PVD), or another deposition technique. In some embodiments, the bottom-up formation of the conductive feature 601 is achieved by PVD sputtering. In other embodiments, the bottom-up formation of the conductive feature 601 is achieved by using a self-alignment monolayer (SAM) inhibitor on dielectric surfaces while performing CVD growth over conductive surfaces. In some embodiments, the conductive feature 601 may be or comprise tungsten (W), cobalt (Co), copper (Cu), ruthenium (Ru), aluminum (Al), gold (Au), silver (Ag), alloys thereof, the like, or a combination thereof.

Figure 7:
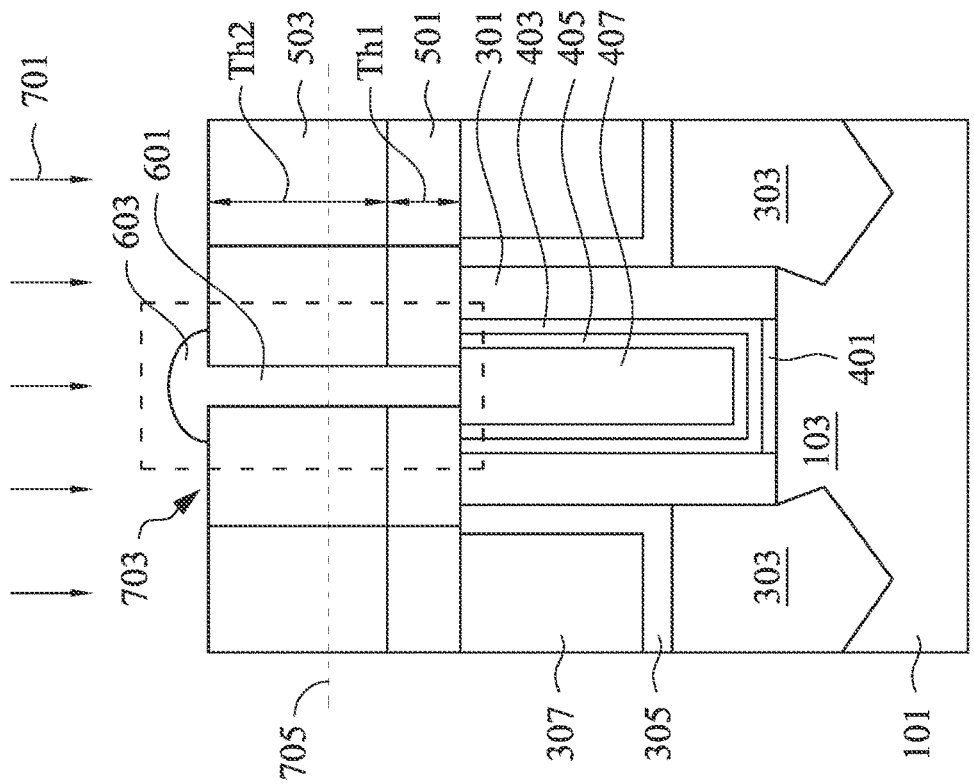

FIG. 7 illustrates that, once the conductive feature 601 has been deposited (e.g., without using any adhesion layer or barrier layer), a first implantation process 701 may be performed to apply a compression between the conductive feature 601 and the second interlayer dielectric layer 503 to close any gaps due to the absence of the adhesion layer or barrier layer. In particular, FIG. 7 schematically demonstrates the results of the first implantation process 701, according to some embodiments. The first implantation process 701 may be used for example to eliminate or reduce any gaps located between the conductive feature 601 and the surrounding dielectric material, such as the second ILD 503 and the ESL 501. In some embodiments, after formation of the conductive feature 601, ion beams of one or more species of neutral elements are projected towards the dielectric material, such as the second ILD 503 and the ESL 501, by the first implantation process 701. In some embodiments, the neutral elements are implanted to the second ILD 503 and the ESL 501 to modify the physical properties of the second ILD 503 and the ESL 501, such as volume and stress, but without significantly altering the one or more species of neutral elements that are implanted at a desired depth and at a desired concentration to close the path from the top surface to layers under the conductive features 601. In some embodiments, the one or more species of neutral elements include germanium (Ge), argon (Ar), silicon (Si), or other elements with a larger atomic volume than the material into which the neutral elements are being implanted.

To obtain the one or more neutral elements, a neutral element precursor is first chosen. In embodiments which use germanium (Ge) as the neutral element, a germanium containing ion precursor may be utilized as a source. For example, in some embodiments the germanium containing ion precursor may be germanium tetrafluoride GeF$^4$. However, any suitable ion precursor may be utilized.

Additionally, and looking closer at an embodiment in which germanium tetrafluoride is utilized, the germanium tetrafluoride may be in either a natural state (e.g., a "natural gas") or else in a concentrated state. For example, when the natural gas is utilized, the natural gas will comprise a concentration profile 703 with a range of different isotopes (e.g., $^{70}$Ge, $^{72}$Ge, $^{73}$Ge, $^{74}$Ge, $^{76}$Ge, or the like). In such an embodiment, the natural gas comprises a concentration of $^{74}$Ge isotope that is greater than a concentration of $^{72}$Ge isotope. For example, the natural gas may have a ratio of germanium isotopes of about 20.52% of $^{70}$Ge (e.g., about 21%), about 27.45% of $^{72}$Ge (e.g., about 27%), about 7.76% of $^{73}$Ge (e.g., about 8%), about 36.52% of $^{74}$Ge (e.g., about 36%), and about 7.75% of $^{76}$Ge (about 8%).

However, when a more concentrated state is utilized (usually to avoid arsenic contamination since arsenic is very close to the mass volume of the $^{74}$Ge isotope), the concentration of the $^{72}$Ge isotope may be increased relative to the other isotopes, resulting in a more concentrated, enriched gas. The optional enriched gas extracts the $^{72}$Ge isotopes, resulting in a higher concentration of the isotope $^{72}$Ge as compared the concentration of $^{72}$Ge in the natural gas. For example, the ratio of Ge isotopes of $^{70}$Ge is about 51%

Of course, while the above descriptions utilize germanium precursors as the precursor gas, this is intended to be illustrative and is not intended to be limiting. Rather, when other suitable ion sources (e.g., Ar, Si, or the like) is desired to be, other suitable precursors may be utilized in order to obtain the desired ions. Any suitable precursors may be utilized.

According to some embodiments, the species implanted in the second ILD 503 and the ESL 501 cause the second ILD 503 and the ESL 501 to expand. The expansion can occur in all directions which induces compression at an interface between the conductive feature 601 and the second ILD 503 and/or the ESL 501 to close any gaps there between. The expansion can occur along the direction of depth. In some embodiments, the expansion along the direction of depth may be measured to indicate the overall amount of expansion thus determining the compression between the conductive feature 601 and the second ILD 503 and the ESL 501.

FIG. 7 further illustrates a concentration profile 703 (located only adjacent to the conductive feature 601) that is an implant species concentration profile of the ions along the depth of the second ILD 503 and the ESL 501 in an example of germanium (Ge) implantation. The concentration profile 703 represents the percentage of the ions of the species implanted, according to some embodiments. According to some embodiments, the percentages of the isotopes implanted may be adjusted for a desired concentration profile to be implanted by the first implantation process 701 by adjusting a valve opening of an ion implanter (see, e.g., the ion implanted discussed below with respect to FIG. 8) and increasing a beam current of the ions being implanted to a first beam current level. Details of the ion implanter and implantation process are discussed in greater detail below.

Figure 8:
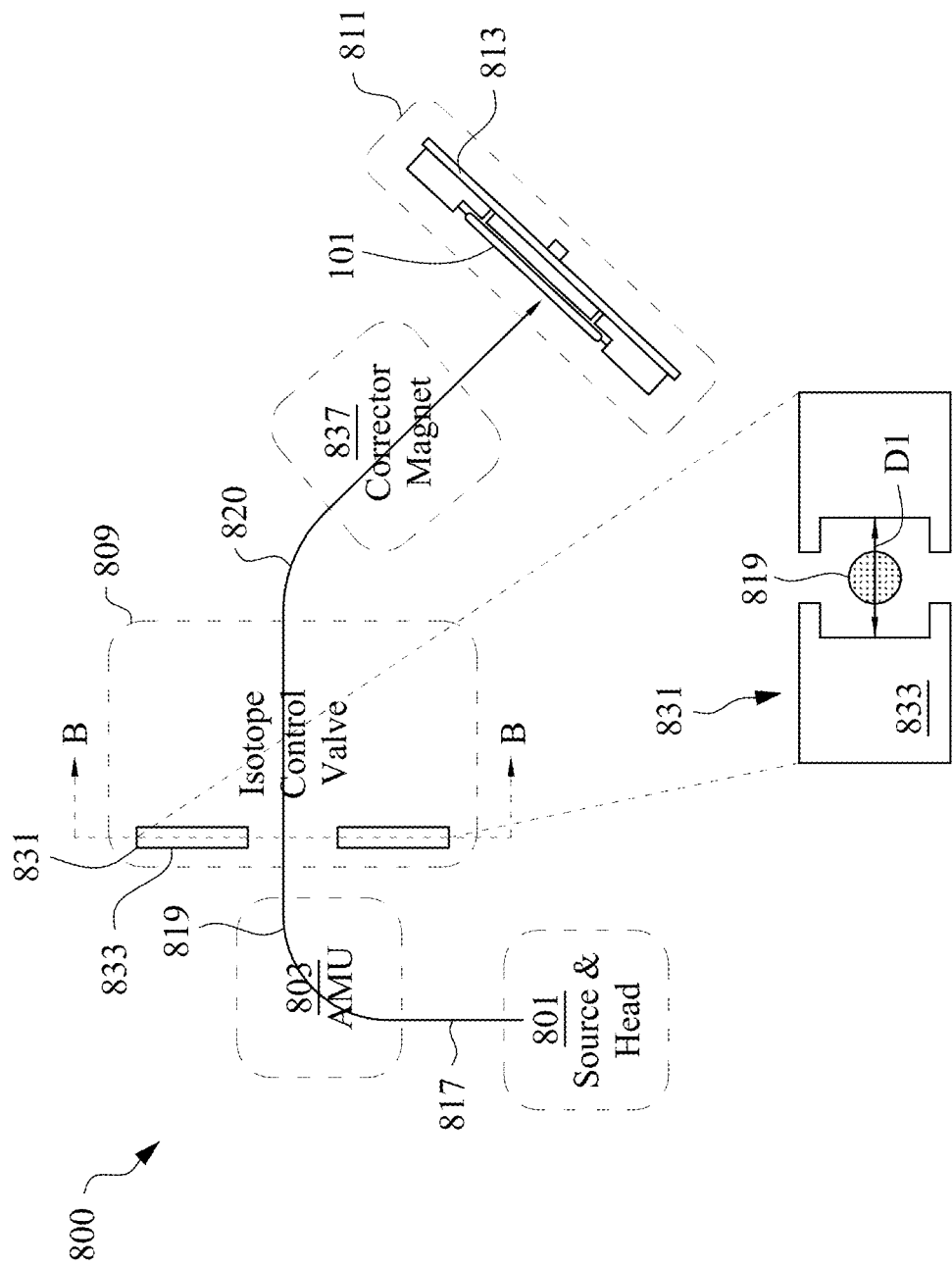
FIG. 8 illustrates an ion implanter, according to some embodiments.

FIG. 8 illustrates an ion implanter 800 and the first implantation process 701 that can be used to implant the neutral ions. In a particular embodiment, to perform the first implantation process 701, the semiconductor substrate 101 is placed inside of the ion implanter 800. In an embodiment, the ion implanter 800 includes a source and head station 801, an analyzer magnet unit (AMU) 803, an aperture 831 within an isotope control valve 809, a corrector magnet 837, an end station 811, and a wafer handling unit 813. The ion implanter 800 may further comprise optional units (e.g., linear accelerators, convergence elements, or the like) and a controller to control the operation of the ion implanter 800. FIG. 8 further illustrates a cut-line B-B through the aperture 831 and a cross-sectional view of the aperture 831, according to some embodiments.

The source and head station 801 produces an ion beam 817 from the desired ion precursor (e.g., germanium tetrafluoride, either the natural gas version or the concentrated version). However, as the source and head station 801 produces ions having a range of charge-to-mass ratio and only a certain range of ions are suitable for implantation, the ion beam 817 is directed towards the analyzer magnet unit 803 in order to obtain a coherent ion beam 819. The analyzer magnet unit 803 electromagnetically separates those ions having a desired charge-to-mass ratio for implantation from those ions having an undesired charge-to-mass ratio. Once the coherent ion beam 819 of suitable charge-to-mass ratio has been obtained, the coherent ion beam 819 is sent to the isotope control valve 809.

The coherent ion beam 819 passes through the isotope control valve 809 in order to further enhance and control the divergence of the coherent ion beam 819 to form an implantation ion beam 820. In an embodiment the isotope control valve 809 comprises the aperture 831, and the aperture 831 has an adjustable width that can be used to adjust the magnitude of the coherent ion beam 819. For example, the aperture 831 may comprise movable plates 833 (e.g., scanners, energy resolving slits, mass analysis slits, or the like) such that spacing between the movable plates 833 can be adjusted, thereby allowing for an adjustment of the beam current magnitude. According to some embodiments, the spacing between the movable plates 833 may be a first distance D1 in a range between about 0 inches and about 10 inches. However, any suitable distance may be used. For example, in particular embodiments, the first implantation process 701 may be performed with the first distance D1 being between about 0 inches and about 2.5 inches. However, any suitable distance may be used.

Once the coherent ion beam 819 passed through the isotope control valve 809, the implantation ion beam 820 moves to the corrector magnet 837, which may be utilized between the isotope control valve 809 and the end station 811, in accordance with some embodiments. The corrector magnet 837 is utilized to re-direct and bend the path of the coherent ion beam 819 to the desired finalized location (e.g., the semiconductor substrate 101). However, other suitable components may be utilized.

Once the implantation ion beam 820 has been modified through the isotope control valve 809 and/or re-directed by the corrector magnet 837, the implantation ion beam 820 is directed towards the end station 811. The end station 811 houses the wafer handling unit 813, which handles the semiconductor substrate 101 which will be implanted with ions from the implantation ion beam 820. The wafer handling unit 813 is utilized to move the semiconductor substrate 101 in relation to the implantation ion beam 820 so as to illuminate different sections of the semiconductor substrate 101 with the implantation ion beam 820. For example, the wafer handling unit 813 may comprise two motors (not shown) which may be used to control the position of the semiconductor substrate 101 in at least two directions, such as an x-direction and a y-direction, relative to the implantation ion beam 820.

However, as one of ordinary skill in the art will recognize, moving the semiconductor substrate 101 in relation to the implantation ion beam 820 is merely one method of illuminating different sections of the semiconductor substrate 101 with the implantation ion beam 820. Other suitable methods, such as the use of deflection electrodes along the path of the implantation ion beam 820 to shift the direction of the implantation ion beam 820 in relation to the semiconductor substrate 101 instead of shifting the semiconductor substrate 101 in relation to the implantation ion beam 820, using a multiple wafer rotating system to illuminate multiple wafers in order, or using angular implantation methods, may also be utilized. These methods, and any other suitable method for illuminating different portions of the semiconductor substrate 101 with the implantation ion beam 820, are fully intended to be included within the scope of the present disclosure.

Additionally, while a number of parts of the ion implanter 800 have been described in detail, the description of these parts is intended to be illustrative and is not intended to be limiting, as any suitable parts may be utilized. For example, in some embodiments, an optional linear accelerator may be arranged between the analyzer magnet unit 803 and the isotope control valve 809. The optional linear accelerator is used to impart additional energy to the coherent ion beam 819 as it passes through the optional linear accelerator. The optional linear accelerator imparts this additional energy using a series of electrodes (not shown) that generate an electromagnetic field which, when the coherent ion beam 819 passes through the field, works to accelerate the coherent ion beam 819. The optional linear accelerator may vary the electromagnetic fields periodically with time or may adjust the phase of the electromagnetic fields to accommodate ions with different atomic numbers as well as ions having different initial speeds.

In other embodiments, an optional convergence unit may also be arranged between the analyzer magnet unit 803 and the isotope control valve 809. In embodiments that use the optional linear accelerator, the convergence unit may be arranged between the optional linear accelerator and the isotope control valve 809. The optional convergence unit is utilized to modify the convergence and divergence of the coherent ion beam 819. The coherent ion beam 819 arrives at the optional convergence unit as a substantially parallel beam. In an embodiment, the optional convergence unit comprises one or more (such as three) multipole lenses, such as a uniformity multipole lens and a collimator multipole lens to modify the convergence and divergence of the coherent ion beam 819. However, any suitable number and type of lenses may be utilized.

A controller (not separately illustrated in FIG. 8) is used to control the operating parameters of the ion implanter 800 during operation. The controller may be implemented in either hardware or software, and the parameters may be hardcoded or fed into the controller through an input port. The controller may be used to store and control parameters associated with the operation of the ion implanter 800, such as the desired ion beam current, the current to the analyzer magnet unit 803, the controls to the isotope control valve 809, the current to the corrector magnet 837, and the like. Additionally, the controller may also be used to control the wafer handling unit 813 and, more specifically, the velocity of the motors of the wafer handling unit 813, which, in turn, control the velocity of the semiconductor substrate 101 with respect to the implantation ion beam 820.

During the first implantation process 701, the ion beam 817 is generated by the source and head station 801 using the precursor material. In an embodiment in which the natural gas (e.g., germanium tetrafluoride with a natural distribution of $^{74}$Ge) is utilized as the precursor, the first implantation process 701 may be performed at an energy level in a range from about 2 k eV to about 50 k eV, with a dosage level in a range from about $1 \times 10^{14}$ counts/cm$^2$ to about $1 \times 10^{16}$ counts/cm$^2$. Additionally, the first implantation process 701 may be performed at a tilt angle of between about 0° and about 80°, and at a temperature between about −100° C. and about 500° C. However, any suitable process parameters may be utilized.

Additionally, by increasing and decreasing the first distance D1 (e.g., opening and closing the valve), the precise distribution of the desired isotopes (e.g., germanium isotopes) that is implanted into the structure may be finely controlled. For some applications, the valve opening may be adjusted for the first implantation process 701, allowing for profile adjustments of the $^{72}$Ge isotope concentration percentages to be between about 48.5% and about 98.7%. In particular embodiments, the opening of the valve can be adjusted between about 0 inches and about 2.5 inches for the first implantation process 701 to achieve different ratios of Ge isotopes between $^{70}$Ge/$^{72}$Ge/$^{73}$Ge/$^{74}$Ge/$^{76}$Ge. By adjusting the ratio of Ge isotopes, the beam current (e.g., the total implanted charge divided by the implantation time) may be also be adjusted (e.g., increased), such as by being between about 6.75 mA and about 12.5 mA, such as about 9 mA).

For example, in a particular embodiment using the natural gas as the ion source and having the first distance D1 being about 0.35 inches, a first isotope profile may comprise a ratio of germanium dosage (atom/cm$^2$) distribution of about 0.09% of $^{70}$Ge, 98.69% of $^{72}$Ge (greater than 90% impurity for $^{72}$Ge), 1.1% of $^{73}$Ge, 0.11% of $^{74}$Ge, and an undetectable amount of $^{76}$Ge. In an embodiment using the natural germanium gas as an ion source and having the first distance D1 being about 0.5 inches, a second profile may comprise a ratio of germanium dosage (atom/cm$^2$) distribution of about 0.13% of $^{70}$Ge, 83.7% of $^{72}$Ge, 16.04% of $^{73}$Ge, 0.13% of $^{74}$Ge, and an undetectable amount of $^{76}$Ge. In an embodiment using the natural germanium gas as an ion source and having the first distance D1 being about 0.7 inches, a third profile may comprise a ratio of germanium dosage (atom/ cm$^2$) distribution of about 0.21% of $^{70}$Ge, 81.72% of $^{72}$Ge, 17.84% of $^{73}$Ge, 0.22% of $^{74}$Ge, and an undetectable amount of $^{76}$Ge. In an embodiment using the natural germanium gas as an ion source and having the first distance D1 being about 0.9 inches, a fourth profile may comprise a ratio of germanium dosage (atom/cm$^2$) distribution of about 0.33% of $^{70}$Ge, 81.23% of $^{72}$Ge, 17.97% of $^{73}$Ge, 0.47% of $^{74}$Ge, and an undetectable amount of $^{76}$Ge. In an embodiment using the natural germanium gas as an ion source and having the first distance D1 being about 1.1 inches, a fifth profile may comprise a ratio of germanium dosage (atom/cm$^2$) distribution of about 0.69% of $^{70}$Ge, 68.83% of $^{72}$Ge, 14.63% of $^{73}$Ge, 15.84% of $^{74}$Ge, and 0.01% of $^{76}$Ge. In an embodiment using the natural germanium gas as an ion source and having the first distance D1 being about 1.3 inches, a sixth profile may comprise a ratio of germanium dosage (atom/cm$^2$) distribution of about 19.7% of $^{70}$Ge, 54.21% of $^{72}$Ge, 11.77% of $^{73}$Ge, 14.31% of $^{74}$Ge, and an undetectable amount of $^{76}$Ge. In an embodiment using the natural germanium gas as an ion source and having the first distance D1 being about 1.5 inches, a seventh concentration profile may comprise a ratio of germanium dosage (atom/cm$^2$) distribution of about 28.22% of $^{70}$Ge, 48.47% of $^{72}$Ge, 10.48% of $^{73}$Ge, 12.82% of $^{74}$Ge, and an undetectable amount of $^{76}$Ge. However, any suitable ion source may be used and any suitable profile may be implanted.

Additionally, in some embodiments it may be beneficial to implant an active ion in addition to the neutral ions. In such an embodiment, an active ion such as arsenic may be implanted simultaneously with the neutral element (e.g., germanium) using an active ion source gas such as GeF$_4$. However, any suitable ions, and any combination of such ions, may be utilized.

Figure 9A:
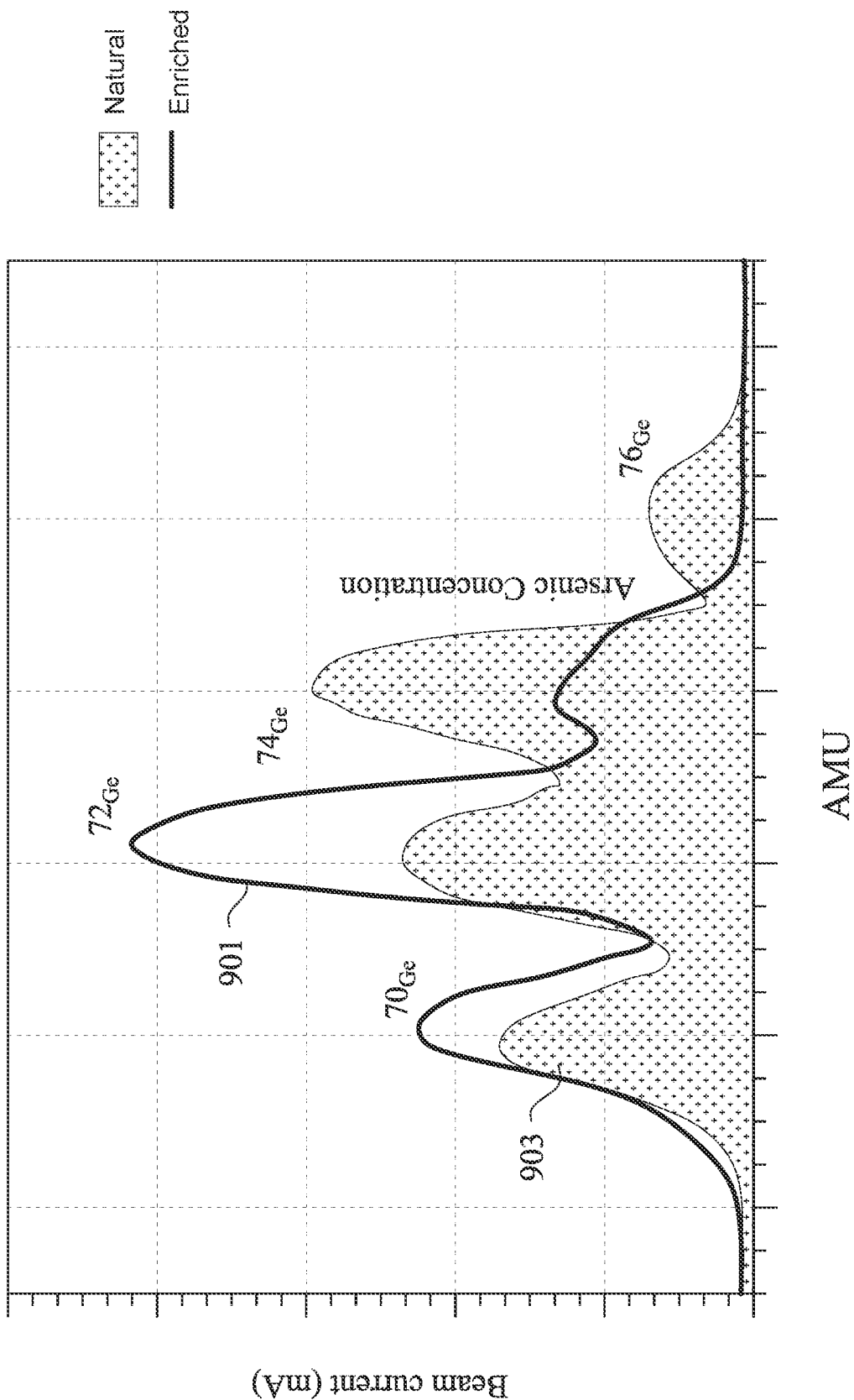
FIGS. 9A-9D are graphs illustrating one or more concentration profiles, beam currents, and spectrums used during ion implantations, according to some embodiments.

FIG. 9A is a graph illustrating peak values of different germanium isotopes versus beam currents in mA used for the analyzer magnet unit 803 during implantation of germanium ions using both the natural gas and also using the enriched gas. For example, in this chart embodiments using the enriched gas an ion source for the first implantation process 701 are labeled with reference number 901 in FIG. 9A. Embodiments using the natural gas as an ion source for the first implantation process 701 are labeled with reference number 903 in FIG. 9A.

Figure 9B:
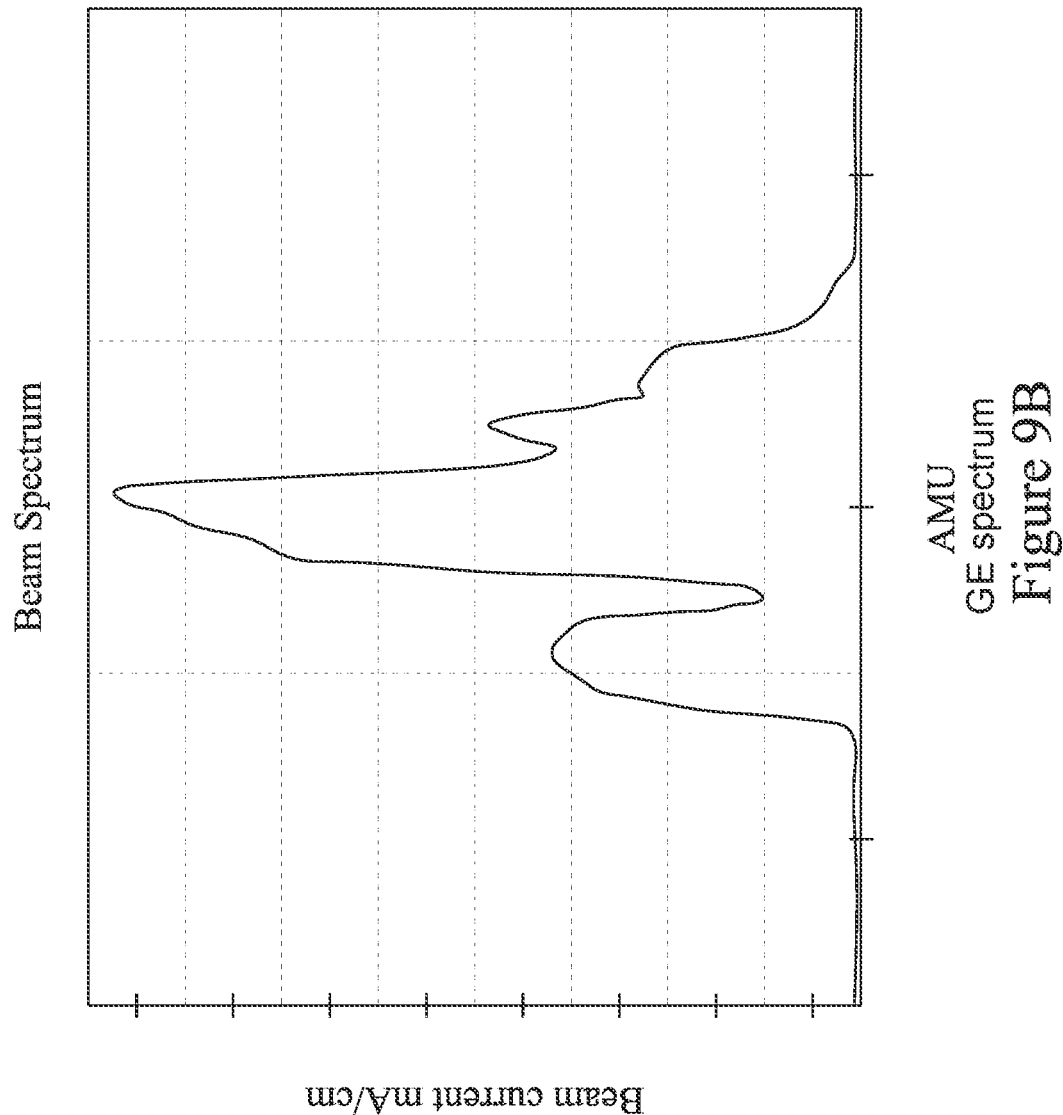

Additionally, as can be seen in FIG. 9A, the arsenic remains the same regardless of which germanium source gas is utilized. As such, in those embodiments in which arsenic poisoning is not as large a concern (e.g., in processes such as the dielectric property modifications described herein), by modifying the opening of the valve the natural gas precursor (which has a lower amount of $^{72}$Ge and a larger amount $^{74}$Ge) may be used without the need for using the enriched gas. Such a use allows for a overall higher beam current, which allows for an overall higher throughput using a less expensive precursor (e.g., the natural gas precursor). FIG. 9B is a graph illustrating a germanium spectrum peak concentration implant for different germanium isotopes versus beam currents in mA/cm during implantation using the natural gas precursor.

Figure 9C:
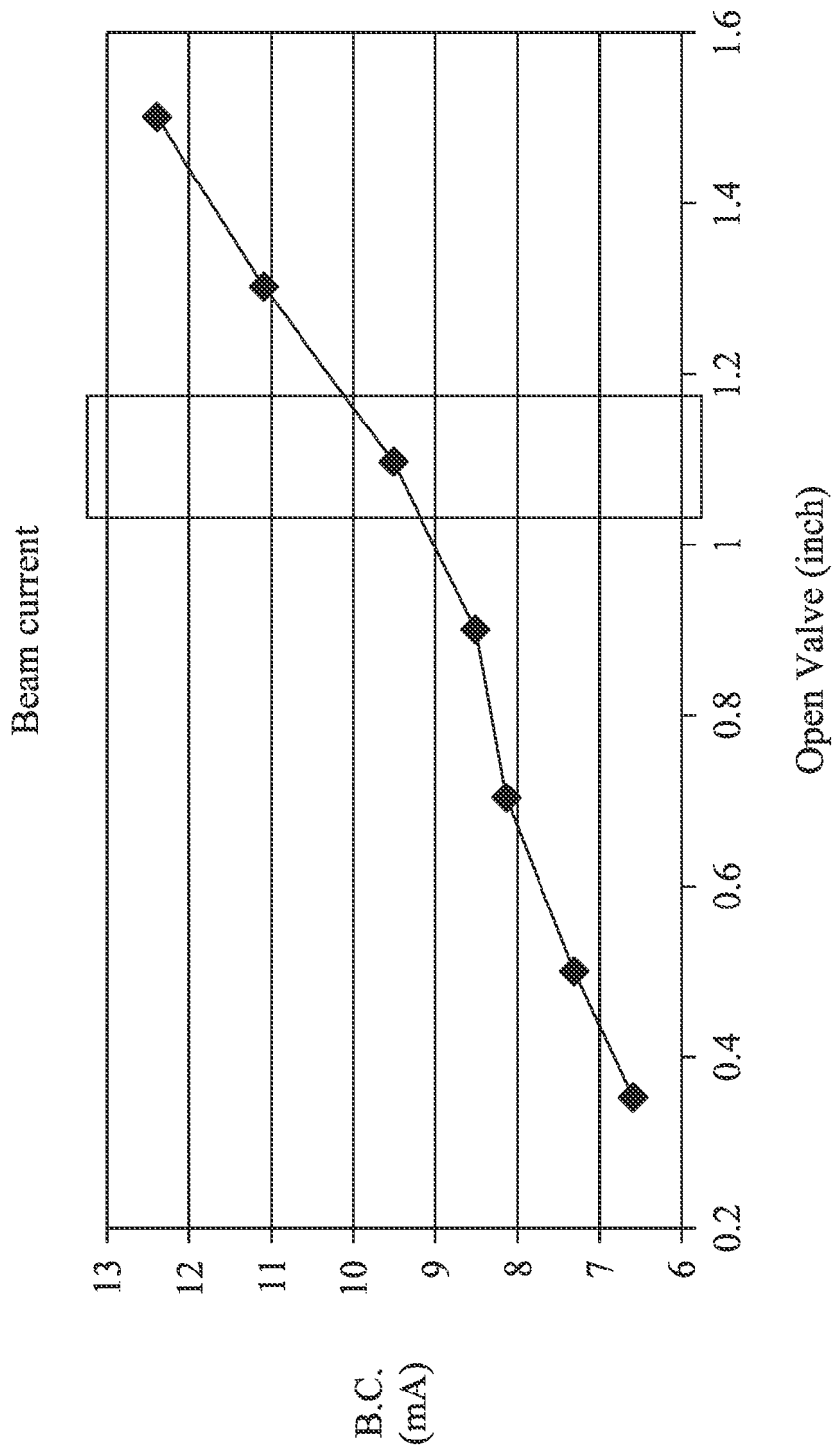

FIG. 9C is a graph illustrating beam current versus valve opening during an implantation process. In embodiments which use a first valve opening of about 0.35 inches, a first beam current of about 6.5 mA may be used. In embodiments which use a second valve opening of about 0.5 inches, a second beam current of about 7.25 mA may be used. In embodiments which use a third valve opening of about 0.7 inches, a third beam current of about 8.0 mA may be used. In embodiments which use a fourth valve opening of about 0.9 inches, a fourth beam current of about 8.5 mA may be used. In embodiments which use a fifth valve opening of about 1.1 inches, a fifth beam current of about 9.5 mA may be used. In embodiments which use a sixth valve opening of about 1.3 inches, a sixth beam current of about 11.25 mA may be used. In embodiments which use a seventh valve opening of about 1.5 inches, a seventh beam current of about 12.5 mA may be used.

Figure 9D:
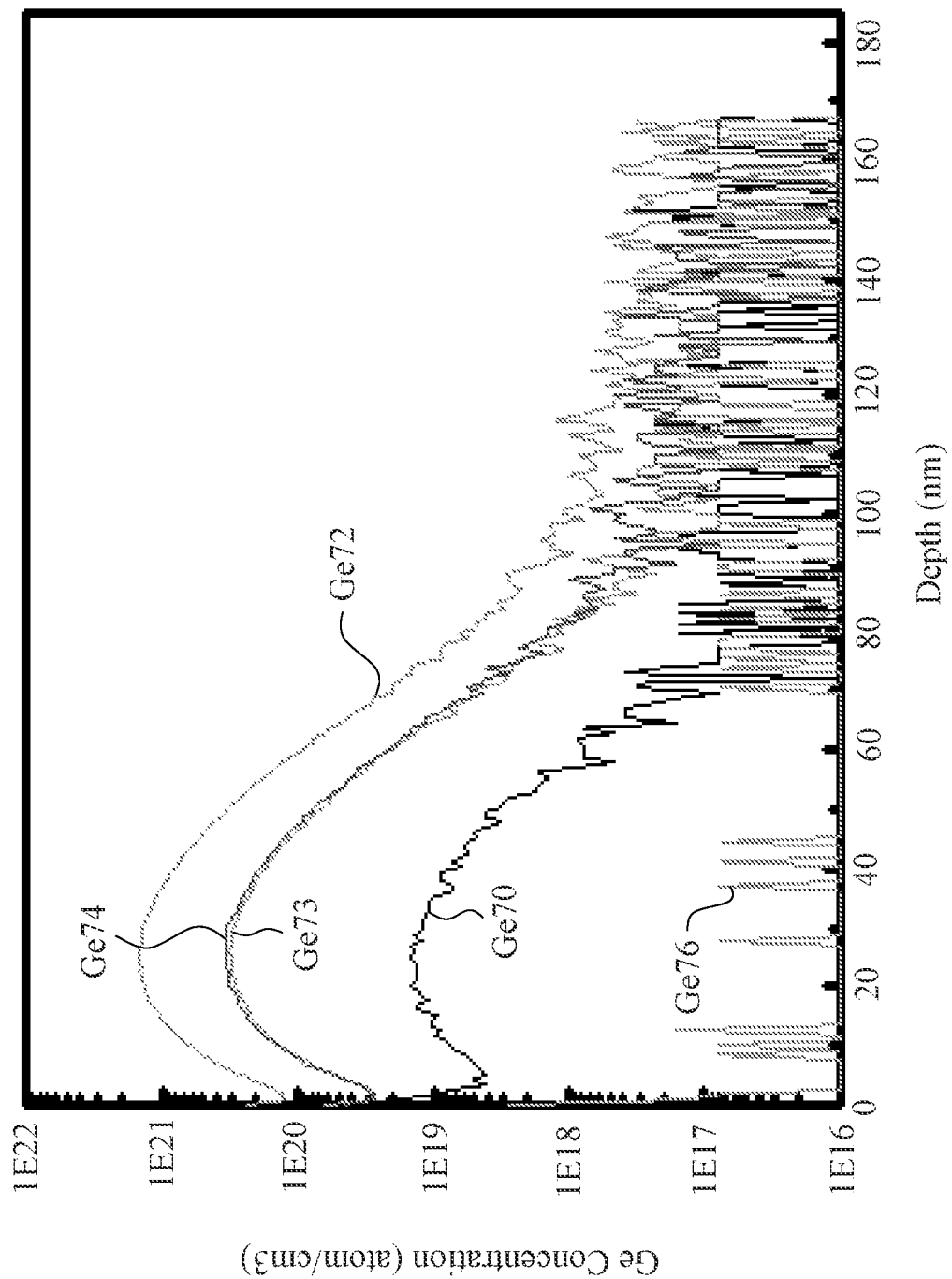

FIG. 9D is a graph illustrating concentration profiles for germanium implantation versus depth of implantation into Si substrate for an implantation process using a valve opening of about 1.1 inches, according to some embodiments. In an embodiment, a first concentration profile for $^{70}$Ge may be between about $1.5E^{18}$ atoms/cm$^3$ and about $1.5E^{17}$ atoms/cm$^3$, a second concentration profile for $^{72}$Ge may be between about $1.5E^{20}$ atoms/cm$^3$ and about $1.5E^{18}$ atoms/cm$^3$, a third concentration profile for $^{73}$Ge may be between about $1.75E^{19}$ atoms/cm$^3$ and about $1.75E^{18}$ atoms/cm$^3$, a fourth concentration profile for $^{74}$Ge may be between about $1.75E^{19}$ atoms/cm$^3$ and about $1.75E^{18}$ atoms/cm$^3$, and a fifth concentration profile for $^{76}$Ge may be between an undetectable amount and about $1.0E^{17}$ atoms/cm$^3$.

Returning now to FIG. 7, once the implantation has been completed, FIG. 7 further illustrates line 705 which indicates a depth level where a subsequent CMP process (described further below) ends. The portion of the second ILD 503 under the line 705 remains in the device while the portion of the second ILD 503 above the line 705 is removed during the planarization process. In some embodiments, the first implantation process 701 is designed so that the peak concentration point is at a depth level above the line 705. Such a configuration can ensure that the portion of the second ILD 503 interacting with the CMP slurry has high compression towards the conductive feature 601 to cut off the path of the slurry to the underlying layers, thereby preventing undesired damage.

The conductive feature 601, having a denser crystalline structure than the second ILD 503, is more difficult for the implanted species to penetrate. As a result, the implanted species are concentrated in a shallower depth in the conductive feature 601 than in the second ILD 503. In some embodiments, the majority of the implanted species in the conductive feature 601 is above the line 705, and thus, will be removed by the planarization process.

Additionally, once the first implantation process 701 has been performed, an optional thermal anneal is performed. The optional thermal anneal may be performed in order to adjust a crystalline structure and reduce damage caused by the first implantation process 701 in the implanted layers.

Figure 10:
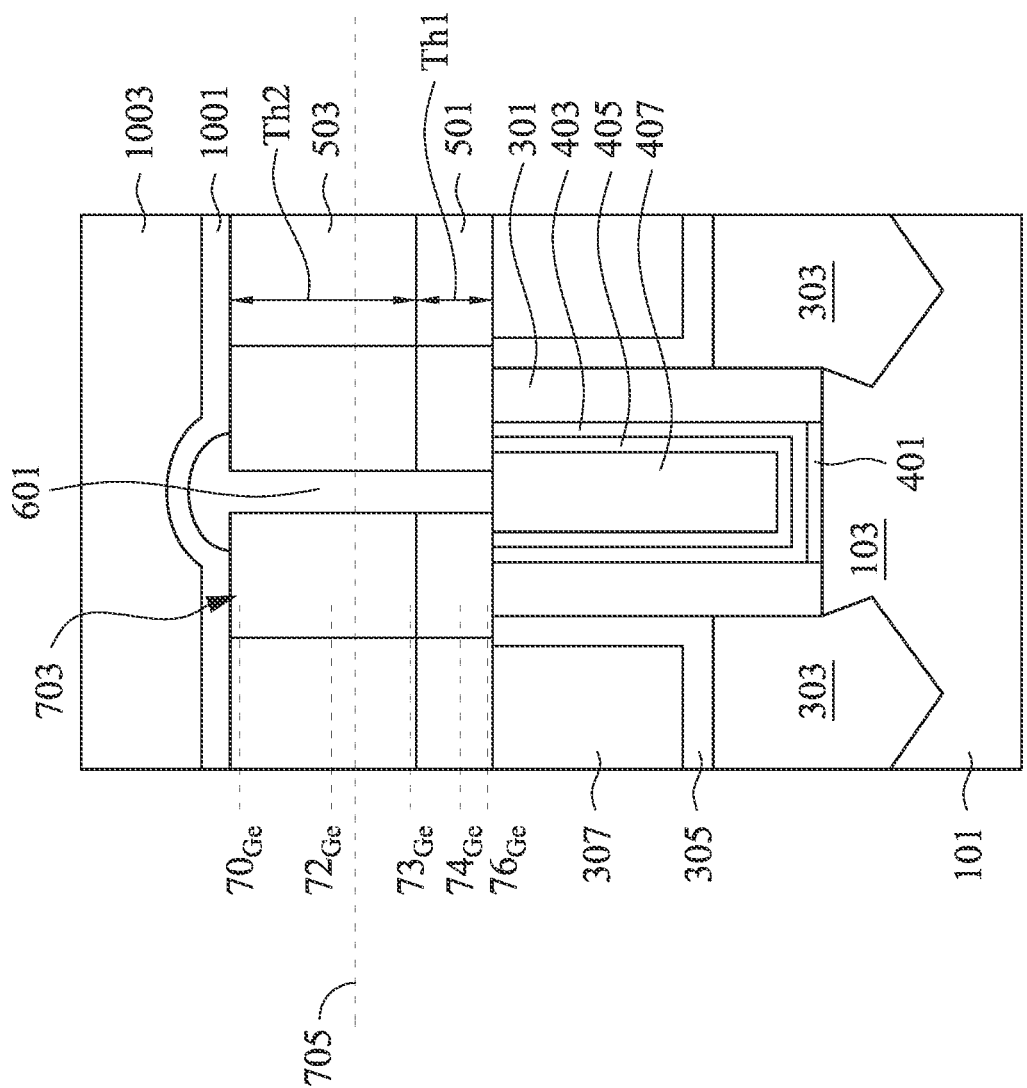
FIGS. 10 and 11 illustrate cross-sectional views of respective intermediate structures at respective stages during the example method for forming a conductive feature in accordance with some embodiments.

In FIG. 10, a barrier layer 1001 is formed over the conductive feature 601 and remaining portions of the second ILD 503 not covered by the conductive feature 601. The barrier layer 1001 may be or may comprise titanium nitride, titanium oxide, tantalum nitride, tantalum oxide, the like, or a combination thereof, and may be deposited by ALD, CVD, or another suitable deposition technique. A blanket conductive layer 1003 is then formed over the barrier layer 1001. The blanket conductive layer 1003 may fill up other recesses or openings in the second ILD 503 not illustrated in these figures. In some embodiments, the blanket conductive layer 1003 can be deposited by CVD, ALD, ELD, physical vapor deposition (PVD), electroplating, or another suitable deposition technique. In some embodiments, the blanket conductive layer 1003 may be or may comprise tungsten (W), cobalt (Co), copper (Cu), ruthenium (Ru), aluminum (Al), gold (Au), silver (Ag), alloys thereof, the like, or a combination thereof. In some embodiments, the blanket conductive layer 1003 and the conductive feature 601 may include the same material. The blanket conductive layer 1003 also brings the surface of the substrate in a condition for a CMP process.

Figure 11:
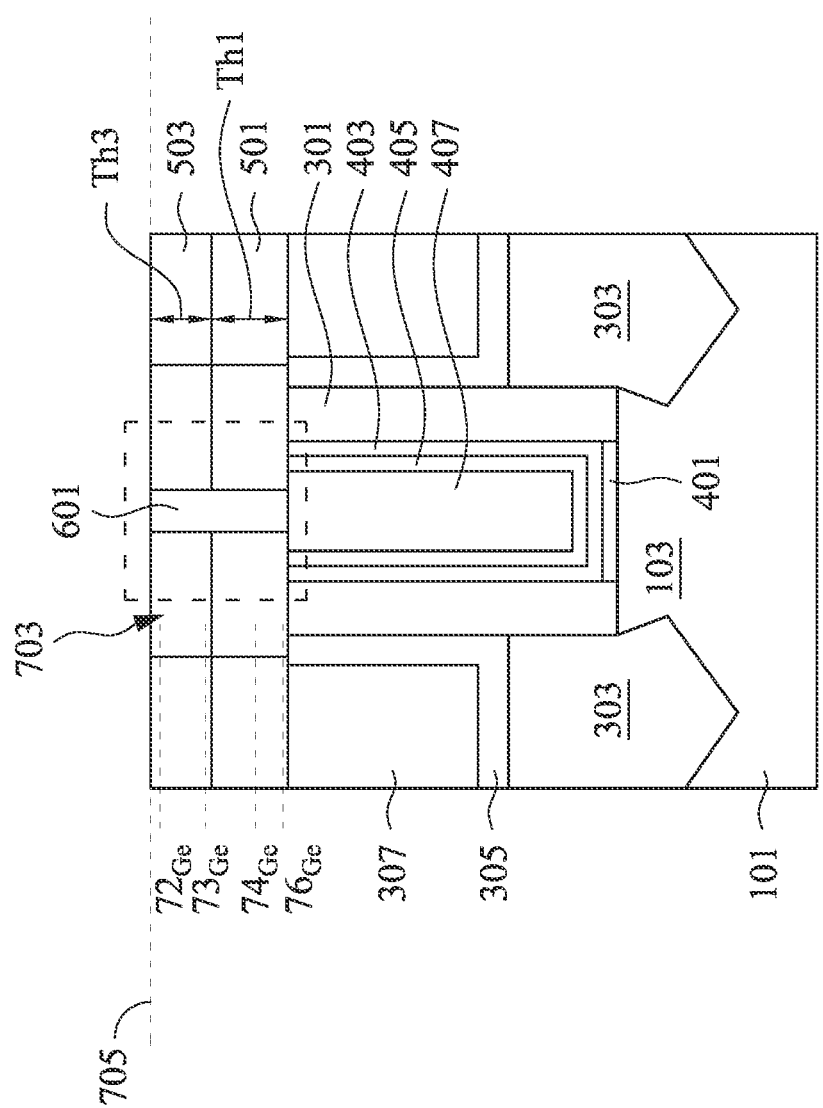

In FIG. 11, a planarization process, such as a CMP, is performed to remove excess amounts of the blanket conductive layer 1003, the barrier layer 1001, the second ILD 503, and the conductive feature 601 down to line 705. In some embodiments, a remaining portion of the second ILD 503 has a third thickness Th3 in a range between about 2 nm to about 50 nm, for example about 15 nm, after the planarization process. Because the second ILD 503 and the ESL 501 compress against the conductive feature 601, the CMP slurry may be prevented from penetrating to the gaps around the conductive feature 601 leaving the underlying layer undamaged.

FIG. 11 further illustrates the remaining portions of the concentration profile 703 adjacent the conductive feature 601 after the planarization process, in accordance with some embodiments. In some embodiments, the second ILD 503 and the ESL 501 have an implant species concentration profile that is decreasing with depth. Particularly, after the planarization process, the implant species concentration profile decreases from a peak concentration of the implant species in the remaining portion of the second ILD 503 and the ESL 501, which is proximate a top surface of the remaining portion of the second ILD 503, in a direction towards underlying layers in the semiconductor substrate 101. In some embodiments, the second ILD 503 has an implant species concentration, such as Ge concentration, in a range from about 1E19 atoms/cm3 to about 1E20 atoms/cm3 at a top surface of the second ILD 503, while the ESL 501 has an implant species concentration, such as Ge concentration, in a range from about 1E20 atoms/cm3 to about 1E21 atoms/cm3. However, any suitable concentrations may be utilized.

Although embodiments have been described herein with respect to implantation into the second ILD 503 and the ESL 501 during the formation of the conductive feature 601 (e.g., a dielectric treatment using the ions), the first implantation process 701 described herein may be used for ion implantation using neutral elements (e.g., Ge, Ar, Si, or the like) in any suitable material modification applications. For example, the first implantation process 701 may be used for other dielectric treatments, metal treatments, pre-amorphization implantations (PAI), post silicide implantations (PSI), or the like. Any suitable methods may be utilized.

The present disclosure provides methods for forming conductive features in a dielectric layer using the first implantation process 701. The first implantation process 701 disclosed herein may be conducted using an increased valve opening allowing for the implantation to be performed with an increased beam current, with the increased beam current further allowing the use of a natural gas ion precursor as an additional option for the ion precursor. By modifying the ratio of germanium isotopes through the use of a larger resolving aperture, the overall beam current of the ion beam can be enhanced. As such, previously present limits on the use of the natural gas precursor (previously ameliorated by the use of the enriched precursor) can be removed, allowing for a cost savings to be achieved from the use of the natural gas precursor. Furthermore, by increasing the beam current, the implantations may be performed to desired depths in a short period of time resulting in further cost savings and shorter production times.

In accordance with an embodiment, a method of manufacturing a semiconductor device includes: generating a first ion beam from a first precursor; sending the first ion beam through a valve gap to generate a first implantation ion beam, the first implantation ion beam having a first ratio of isotopes, the valve gap having a first distance; adjusting the first distance of the valve gap to a second distance different from the first distance; generating a second ion beam from the first precursor; and sending the second ion beam through the valve gap with the second distance to generate a second implantation ion beam, the second implantation ion beam having a second ratio of isotopes different from the first ratio of isotopes. In an embodiment the first precursor has a larger concentration of a $^{74}$Ge isotope than a $^{72}$Ge isotope. In an embodiment the first implantation ion beam has a $^{72}$Ge isotope with a concentration profile between 48.5% and 98.7%, inclusive, after the sending the first ion beam through the valve gap. In an embodiment the method further includes implanting the isotopes, wherein the isotopes are implanted at a dose of between about $1\times10^{14}$ and $1\times10^{16}$ atoms per cm$^2$. In an embodiment the method further includes implanting the isotopes, wherein the isotopes are implanted at an energy of between about 2 keV and about 50 keV. In an embodiment the method further includes implanting the isotopes using a tilt angle in a range from greater than 0 degrees to about 80 degrees. In an embodiment the method further includes implanting the isotopes at a temperature between about −100° C. and about 500° C.

In accordance with another embodiment, a method of manufacturing a semiconductor device, the method including: forming an ion beam from a natural gas source of germanium; sending the ion beam through an opening in a valve, the opening being between about 0.35 inches and 1.5 inches wide; and after the sending the ion beam, directing the ion beam to a semiconductor wafer with a beam current of between about 6.75 mA and about 12.5 mA. In an embodiment the ion beam comprises a concentration profile of $^{72}$Ge between 48.5% and 98.7%, inclusive, after the sending the ion beam. In an embodiment the ion beam further comprises arsenic. In an embodiment the directing the ion beam implants the ions at a dose of between about $1\times10^{14}$ and $1\times10^{16}$ atoms per cm$^2$. In an embodiment the directing the ion beam implants the ions at an energy of between about 2 keV and about 50 keV. In an embodiment the directing the ion beam implants the ions at a tilt angle in a range from greater than 0 degrees to about 80 degrees. In an embodiment the directing the ion beam implants the ions at a temperature between about −100° C. and about 500° C.

In accordance with yet another embodiment, a method of manufacturing a semiconductor device, the method including: depositing an etch stop layer over a source/drain region and a gate of a transistor; forming an interlayer dielectric over the etch stop layer; forming an opening through the interlayer dielectric and the etch stop layer exposing a conductive region of the transistor through the opening; depositing a conductive fill material in the opening; and implanting germanium ions into the interlayer dielectric, wherein the implanting the germanium ions uses an ion beam which has a concentration of $^{74}$Ge isotope that is greater than a concentration of $^{72}$Ge isotope, and wherein the ion beam passes through a valve aperture that is between 0.35 inches and about 1.1 inches. In an embodiment the method further includes performing a thermal anneal after the implanting the germanium ions. In an embodiment the implanting the germanium ions is performed at a temperature between about −100° C. and about 500° C. In an embodiment the implanting the germanium ions comprises implanting the $^{72}$Ge isotope having a concentration profile between 68.8% and 98.7%, inclusive. In an embodiment the germanium ions are implanted at a dose of between about $1\times10^{14}$ and $1\times10^{16}$ atoms per $cm^2$. In an embodiment the germanium ions are implanted at an energy of between about 2 keV and about 50 keV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   generating a first ion beam from a first precursor;
   sending the first ion beam through a valve gap to generate a first implantation ion beam, the first implantation ion beam having a first ratio of isotopes, the valve gap being adjustable and having a first distance during the sending the first ion beam;
   adjusting the first distance of the valve gap to a second distance different from the first distance;
   generating a second ion beam from the first precursor; and
   sending the second ion beam through the valve gap with the second distance to generate a second implantation ion beam, the second implantation ion beam having a second ratio of isotopes different from the first ratio of isotopes.

2. The method of claim 1, wherein the first precursor has a larger concentration of a $^{74}Ge$ isotope than a $^{72}Ge$ isotope.

3. The method of claim 1, wherein the first implantation ion beam has a $^{72}Ge$ isotope with a concentration profile between 48.5% and 98.7%, inclusive, after the sending the first ion beam through the valve gap.

4. The method of claim 1, further comprising implanting the isotopes, wherein the isotopes are implanted at a dose of between about $1\times10^{14}$ and $1\times10^{16}$ atoms per $cm^2$.

5. The method of claim 1, further comprising implanting the isotopes, wherein the isotopes are implanted at an energy of between about 2 keV and about 50 keV.

6. The method of claim 1, further comprising implanting the isotopes using a tilt angle in a range from greater than 0 degrees to about 80 degrees.

7. The method of claim 1, further comprising implanting the isotopes at a temperature between about $-100°$ C. and about $500°$ C.

8. A method of manufacturing a semiconductor device, the method comprising:
   forming an ion beam from a natural gas source of germanium;
   sending the ion beam through an opening in a valve, the opening being between about 0.35 inches and 1.5 inches wide; and
   after the sending the ion beam, directing the ion beam to a semiconductor wafer with a beam current of between about 6.75 mA and about 12.5 mA.

9. The method of claim 8, wherein the ion beam comprises a concentration profile of $^{72}Ge$ between 48.5% and 98.7%, inclusive, after the sending the ion beam.

10. The method of claim 8, wherein the ion beam further comprises arsenic.

11. The method of claim 8, wherein the directing the ion beam implants the ions at a dose of between about $1\times10^{14}$ and $1\times10^{16}$ atoms per $cm^2$.

12. The method of claim 8, wherein the directing the ion beam implants the ions at an energy of between about 2 keV and about 50 keV.

13. The method of claim 8, wherein the directing the ion beam implants the ions at a tilt angle in a range from greater than 0 degrees to about 80 degrees.

14. The method of claim 8 wherein the directing the ion beam implants the ions at a temperature between about $-100°$ C. and about $500°$ C.

15. A method of manufacturing a semiconductor device, the method comprising:
   depositing an etch stop layer over a source/drain region and a gate of a transistor;
   forming an interlayer dielectric over the etch stop layer;
   forming an opening through the interlayer dielectric and the etch stop layer exposing a conductive region of the transistor through the opening;
   depositing a conductive fill material in the opening; and
   implanting germanium ions into the interlayer dielectric, wherein the implanting the germanium ions uses an ion beam which has a concentration of $^{74}Ge$ isotope that is greater than a concentration of $^{72}Ge$ isotope, and wherein the ion beam passes through a valve aperture that is between 0.35 inches and about 1.1 inches.

16. The method of claim 15, further comprising performing a thermal anneal after the implanting the germanium ions.

17. The method of claim 15, wherein the implanting the germanium ions is performed at a temperature between about $-100°$ C. and about $500°$ C.

18. The method of claim 15, wherein the implanting the germanium ions comprises implanting the $^{72}Ge$ isotope having a concentration profile between 68.8% and 98.7%, inclusive.

19. The method of claim 15, wherein the germanium ions are implanted at a dose of between about $1\times10^{14}$ and $1\times10^{16}$ atoms per $cm^2$.

20. The method of claim 15, wherein the germanium ions are implanted at an energy of between about 2 keV and about 50 keV.

* * * * *